US008067990B2

(12) United States Patent
Chindo et al.

(10) Patent No.: US 8,067,990 B2
(45) Date of Patent: Nov. 29, 2011

(54) ATOMIC OSCILLATOR

(75) Inventors: Koji Chindo, Kawasaki (JP); Taku Aoyama, Setagaya (JP)

(73) Assignee: Seiko Epson Corporation (JP)

( * ) Notice: Subject to any disclaimer, the term of this patent is extended or adjusted under 35 U.S.C. 154(b) by 233 days.

(21) Appl. No.: 12/486,141

(22) Filed: Jun. 17, 2009

(65) Prior Publication Data

US 2009/0315629 A1 Dec. 24, 2009

(30) Foreign Application Priority Data

Jun. 18, 2008 (JP) ................................ 2008-158840
Apr. 6, 2009 (JP) ................................ 2009-091829

(51) Int. Cl.
*H03L 7/26* (2006.01)

(52) U.S. Cl. ............................ 331/94.1; 331/3; 250/251

(58) Field of Classification Search ............. 331/3, 94.1; 250/251

See application file for complete search history.

(56) References Cited

U.S. PATENT DOCUMENTS

| | | | | |
|---|---|---|---|---|
| 6,320,472 | B1 * | 11/2001 | Vanier | 331/94.1 |
| 6,806,784 | B2 | 10/2004 | Hollberg et al. | |
| 7,652,473 | B2 * | 1/2010 | Kawabata | 324/304 |
| 2006/0002276 | A1 | 1/2006 | Maruyama et al. | |

FOREIGN PATENT DOCUMENTS

JP 10-284772 10/1998

* cited by examiner

*Primary Examiner* — Robert Pascal
*Assistant Examiner* — James Goodley
(74) *Attorney, Agent, or Firm* — Harness, Dickey & Pierce, P.L.C.

(57) ABSTRACT

An atomic oscillator includes: a gas cell in which a gaseous metal atom is sealed; heating units heating the gas cell to a predetermined temperature and being a first heater and a second heater; a light source of exciting light exciting the metal atom in the gas cell; a light detecting unit detecting the exciting light which has passed through the gas cell; a substrate including at least a temperature controlling circuit for the heating units; a first heater wiring coupling the first heater and the substrate; a second heater wiring coupling the second heater and the substrate; and a third heater wiring coupling the first heater and the second heater. In the atomic oscillator, the gas cell includes a cylindrical portion; and windows which respectively seal openings at both ends of the cylindrical portion and constitute an incident surface and an emitting surface on an optical path of the exciting light. The first heater and the second heater are respectively formed on the windows at an incident surface side and an emitting surface side and made of transparent heating materials.

4 Claims, 5 Drawing Sheets

ATOMIC OSCILLATOR

BACKGROUND

1. Technical Field

The present invention relates to an atomic oscillator, in particular, relates to an atomic oscillator that includes a gas cell, of which degradation of heating efficiency is suppressed, has high accuracy, and can be miniaturized.

2. Related Art

Atomic oscillators using alkali metals such as rubidium and cesium need to keep alkali metal atoms in a vapor state with buffer gas in a gas cell when the oscillators use energy transition of the atoms. Therefore, the oscillators operate while maintaining the gas cell, in which the atoms are sealed, at a high temperature. An operating principle of the atomic oscillators is broadly classified into a double resonance method utilizing light exciting alkali metal atoms and micro waves (refer to JP-A-10-284772, as a first example), and a method utilizing quantum interference effect (hereinafter, refereed to as coherent population trapping: CPT) produced by two kinds of interfering light (refer to U.S. Pat. No. 6,806,784 B2, as a second example).

FIG. 6A schematically shows a structure of a related art atomic oscillator utilizing the CPT. An atomic oscillator 250 shown in FIG. 6A includes an optical system that is composed of a semiconductor laser 230 as a light source, a gas cell 210, and a light detector 240 as a light detecting unit, as disclosed in the second example. In the gas cell 210, alkali metal atoms (not shown) such as a rubidium atom and a cesium atom that are quantum absorbers are sealed. The semiconductor laser 230 produces two kinds of laser light (coupling light and probe light) having different wavelengths from each other and outputs the laser light to the gas cell 210. The atomic oscillator 250 detects how much laser light made incident on the gas cell 210 is absorbed by metal atom gas with the light detector 240 so as to detect atomic resonance, and allows a reference signal of a quartz crystal oscillator and the like to synchronize with the atomic resonance at a control system such as a frequency control circuit 220, obtaining an output. The light detector 240 is positioned at an opposite side of the side, at which the semiconductor laser 230 is positioned, of the gas cell 210.

FIG. 6B shows energy levels of the quantum absorbers. The energy levels of the quantum absorbers are expressed by a three-level system (Λ type level system, for example) including two ground levels (a first ground level and a second ground level) and an excitation level. When a difference between two frequencies (ω1 and ω2) of two beams, which are simultaneously radiated, of the resonance light (first resonance light and second resonance light) precisely matches an energy difference between the first ground level and the second ground level, the three-level system can be expressed by a coherent state between the first ground level and the second ground level. That is, the excitation to the excitation level is stopped.

Namely, as shown in an optical absorption spectrum of FIG. 6C, the quantum absorbers in the gas cell 210 absorb the laser light radiated from the semiconductor laser 230 and an optical absorption property (transmission) varies depending on frequency difference between the two kinds of light. When the frequency difference between the coupling light and the probe light has a specific value, neither of two kinds of the light is absorbed but transmits. This phenomenon is known as electromagnetically induced transparency (EIT) phenomenon. The CPT uses the EIT phenomenon so as to detect and use a phenomenon, in which the light absorption is stopped in the gas cell when a wavelength (wavelengths) of one of or both of the two kinds of resonance light (the first resonance light and the second resonance light) is (are) varied, as an EIT signal having a shape like δ function.

Here, when atomic concentration within the gas cell is varied in the atomic oscillator, a degree of absorption of light to the atomic gas is varied, causing an error of detection of the atomic resonance or an impossibility of detection. Therefore, atomic oscillators that are put into practical use include a heating unit for maintaining vapor of atoms within a gas cell at a constant temperature (80° C., for example) and a temperature controlling system controlling the heating unit. However, due to a demand of miniaturizing an electronic apparatus including an atomic oscillator is increased, the atomic oscillator needs to be miniaturized. Therefore, the heating unit of the gas cell is also required to be miniaturized and have a function to maintain the gas cell at a constant temperature.

In response to such demand of miniaturization, US 2006/002276 A1, as a third example, proposes an atomic oscillator having such structure that a film-like heater composed of a transparent heat element having optical transparency is provided at windows, which respectively constitute an incident surface and an emitting surface of light from a light source in an optical path, of a gas cell.

FIG. 7 shows a schematic section of an atomic oscillator (atomic frequency reference) 150 of the third example. The atomic oscillator 150 includes: a gas cell 110 in which gaseous metal atoms are sealed; a first heater 112 and a second heater 113 as heating units which heat the gas cell 110 at a predetermined temperature; a semiconductor laser 130 as a light source of exciting light exciting the metal atoms in the gas cell 110; and a light detector 140 as a light detecting unit which detects the exciting light transmitted through the gas cell 110.

The gas cell 110 is a sealed container having a cylindrical (tubular) shape. The gas cell 110 includes a cylindrical portion 101 as a first layer; a window 102 as a second layer; and a window 103 as a third layer. The window 102 and the window 103 respectively seal both ends of the cylindrical portion 101 and respectively constitute an incident surface and an emitting surface of exciting light in an optical path (shown by an arrow in the drawing). Thus a cavity T2 is formed inside the gas cell 110. Further, on respective outer surfaces of the window 102 and the window 103, the first heater 112 and the second heater 113 are provided. Incident light from the semiconductor laser 130 disposed at the outer side of the window 102 which constitutes the incident surface in the optical path in the gas cell 110 excites the metal atoms while passing through the cavity T2 in the cylindrical portion 101, and the exciting light is emitted toward the light detector 140 disposed at the outer side of the window 103 that constitutes the emitting surface. The window 102 and the window 103 respectively constituting the incident surface and the emitting surface of the exciting light are made of a material having optical transparency such as glass. Therefore, the first heater 112 and the second heater 113 respectively provided on the window 102 and the window 103 need to be made of a transparent heating material having optical transparency. As the heating material having optical transparency, a transparent electrode film made of indium tin oxide (ITO), for example, can be used. Thus the heater 112 and the heater 113 having a film-like shape are used as the heating units, enabling miniaturization of the gas cell 110 and the atomic oscillator 150 including the gas cell 110.

The third example has no description on heater wiring coupling the first heater 112 and the second heater 113 with a controlling circuit substrate including a temperature controlling circuit which controls the heaters 112 and 113. However, since the first heater 112 and the second heater 113 are independently formed respectively on the window 102 and the window 103, the heaters 112 and 113 are separately controlled. Therefore, two heater wirings are required for each of the heaters 112 and 113, that is, four heater wirings in total are required. That is, as shown in FIG. 7, the first heater 112 requires heater wirings 122*a* and 122*b*, and the second heater 113 requires heater wirings 123*a* and 123*b*.

The heater wirings can be heat leaking paths from the respective heaters. Therefore, as the number of heater wirings is increased, heating efficiency of the gas cell may be deteriorated to increase power consumption, or temperature distribution may occur in the gas cell to deteriorate accuracy of the atomic oscillator. Therefore, the number of heater wirings of heaters provided in the gas cell should be decreased as much as possible.

Further, as the number of the heater wirings is increased, a wiring space is enlarged to make it hard to miniaturize the atomic oscillator and the controlling circuit substrate disadvantageously has a complex circuit structure.

SUMMARY

An advantage of the present invention is to provide an atomic oscillator that includes a gas cell, of which degradation of heating efficiency is suppressed, has high accuracy, and can be miniaturized.

The invention can be achieved by a following aspect.

An atomic oscillator according to an aspect of the invention includes: a gas cell in which a gaseous metal atom is sealed; heating units heating the gas cell to a controlled temperature and being a first heater and a second heater; a light source of exciting light exciting the metal atom in the gas cell; a light detecting unit detecting the exciting light which has passed through the gas cell; a substrate including at least a temperature controlling circuit for the heating units; a first heater wiring coupling the first heater and the substrate; a second heater wiring coupling the second heater and the substrate; and a third heater wiring coupling the first heater and the second heater. In the oscillator, the gas cell includes a cylindrical portion; and windows which constitute an incident surface and an emitting surface on an optical path of the exciting light. Further, the first heater and the second heater are respectively formed on the windows at an incident surface side and an emitting surface side and made of transparent heating materials.

According to this structure, since the first heater and the second heater are coupled with the substrate respectively through the first heater wiring and the second heater wiring as the heating units which are formed on the windows of the gas cell, the first heater and the second heater can be driven in a manner coupled with the substrate in series. Thus, the number of heater wirings is smaller in this structure than a case where the first heater and the second heater are independently coupled with the substrate. Therefore, degradation of thermal efficiency of the heaters, which is caused by leak of thermal energy from the heater wirings, can be suppressed and a wiring space of the heater wirings can be reduced. Accordingly, such an atomic oscillator that has a stable oscillation property, is miniaturized, and consumes low amounts of power can be provided.

In the atomic oscillator of the aspect, the third heater wiring may be made of a material same as a material of the first heater and the second heater.

According to this structure, the third heater wiring can be efficiently formed by the same equipment as that used in forming the first heater and the second heater in the gas cell.

In the atomic oscillator of the aspect, a third heater may be formed on the cylindrical portion and serve also as the third heater wiring.

For example, a third heater wiring having a volume and a shape so as to exhibit a constant resistance value can be used as a heater (the third heater). Accordingly, stability of heating efficiency and a temperature of the gas cell can be further improved.

In the atomic oscillator of the aspect, the third heater wiring may be disposed so as to make a current direction of the first heater inverse to a current direction of the second heater.

In a case where the third heater wiring is disposed so as to make the current direction of the first heater same as that of the second heater, a magnetic field may be generated so as to change a resonance frequency due to magnetic force thereof. In the structure of the aspect, a magnetic field is hardly generated in the gas cell so as to be able to prevent deterioration of accuracy of the atomic oscillator.

In the atomic oscillator of the aspect, the light source may be a coherent light source radiating coherent light, and an oscillation frequency may be controlled by utilizing a light absorption property derived from quantum interference efficiency produced when two kinds of the coherent light as exciting light having different wavelengths from each other are made incident.

The atomic oscillator having the above structure utilizes the quantum interference efficiency produced by two kinds of coherent light having different wavelengths, that is, the oscillator utilizes CPT. Thus the length of the gas cell in a traveling direction of the exciting light can be shortened more than that in an atomic oscillator utilizing the double resonance method, so that the atomic oscillator of the aspect is suitable for miniaturization. Accordingly, the number of the heater wirings can be reduced so as to suppress deterioration of thermal efficiency of the first heater and the second heater, whereby the atomic oscillator which is miniaturized and consumes low amounts of power can be provided.

BRIEF DESCRIPTION OF THE DRAWINGS

The invention will be described with reference to the accompanying drawings, wherein like numbers reference like elements.

DESCRIPTION OF EXEMPLARY EMBODIMENT

An atomic oscillator of an embodiment will be described with reference to the accompanying drawings.

Figure 1A:
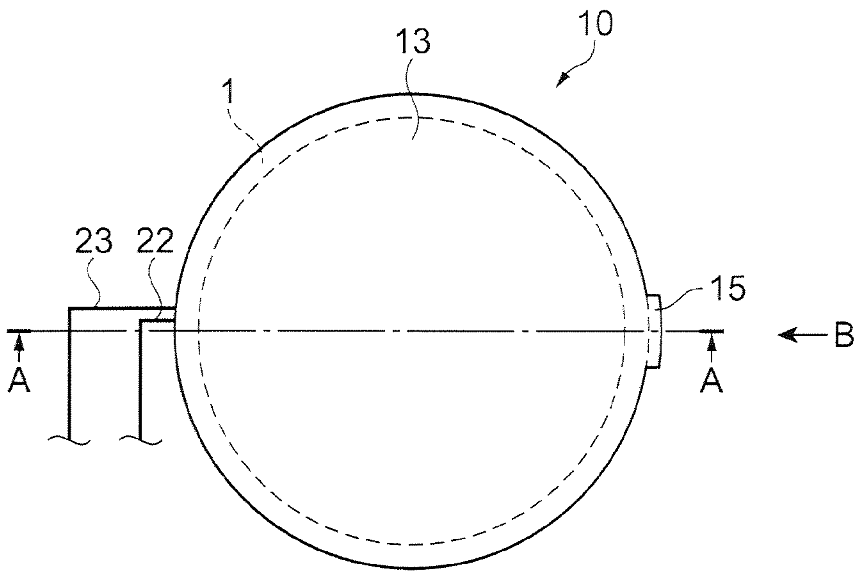
FIG. 1A is a plan view showing a gas cell, viewed from the above, of an atomic oscillator of an embodiment.
Figure 1B:
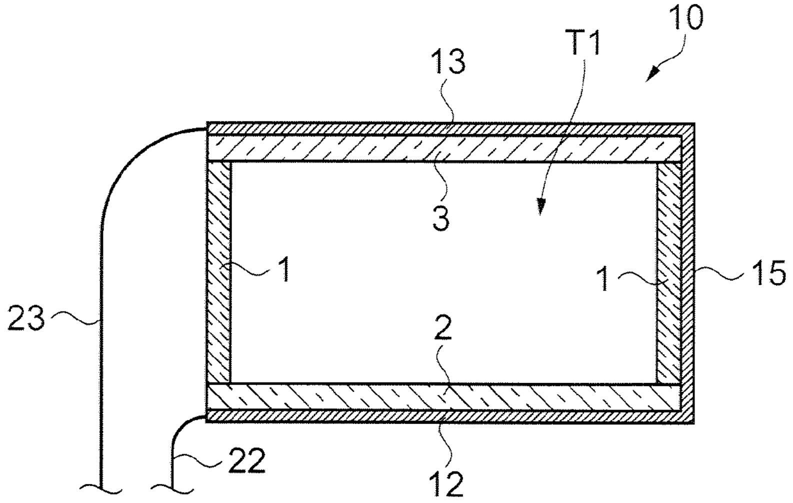
FIG. 1B is a sectional view taken along an A-A line of FIG. 1A.
Figure 1C:
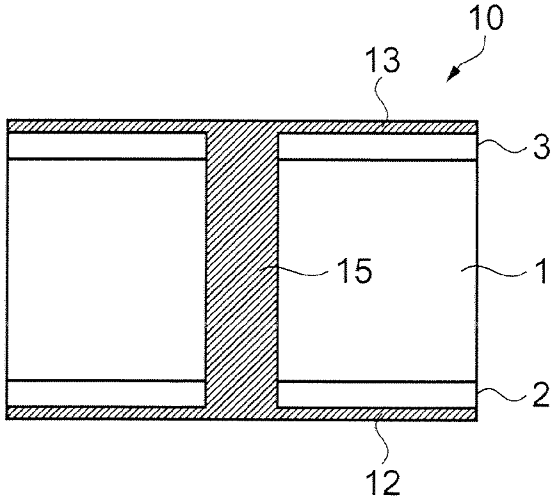
FIG. 1C is a lateral view of the gas cell viewed from a B direction of FIG. 1A.

FIGS. 1A to 1C are diagrams for explaining a gas cell of the atomic oscillator according to the embodiment. FIG. 1A is a plan view of a gas cell viewed from the above. FIG. 1B is a sectional view taken along an A-A line of FIG. 1A. FIG. 1C is a lateral view of the gas cell viewed from a B direction of FIG. 1A. Here, hatching in FIG. 1C does not show a section but distinguishably shows a heater wiring.

Figure 2A:
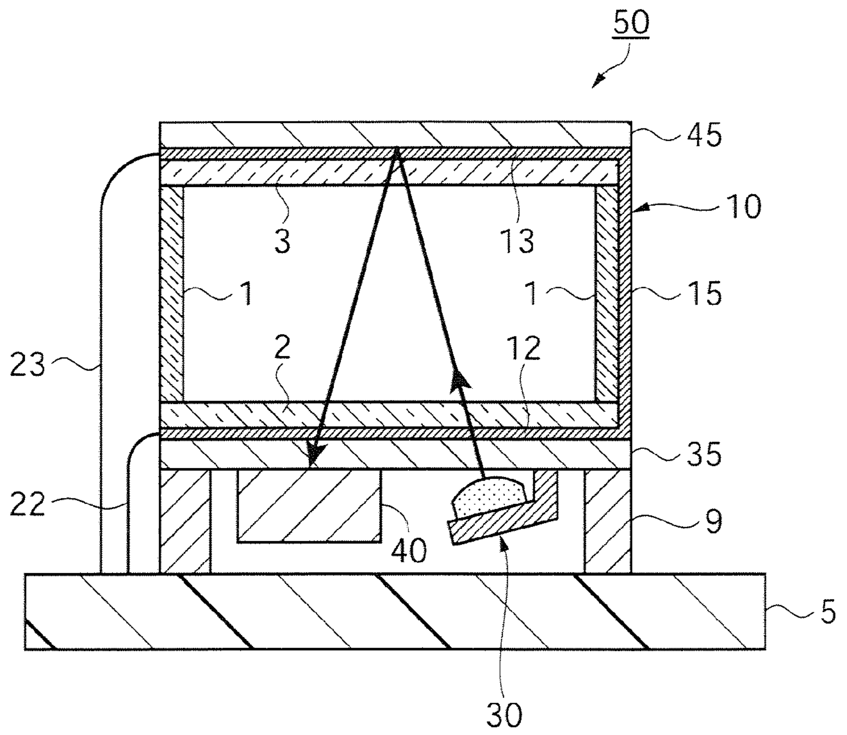
FIG. 2A is a schematic sectional view for explaining the atomic oscillator of the embodiment.
Figure 2B:
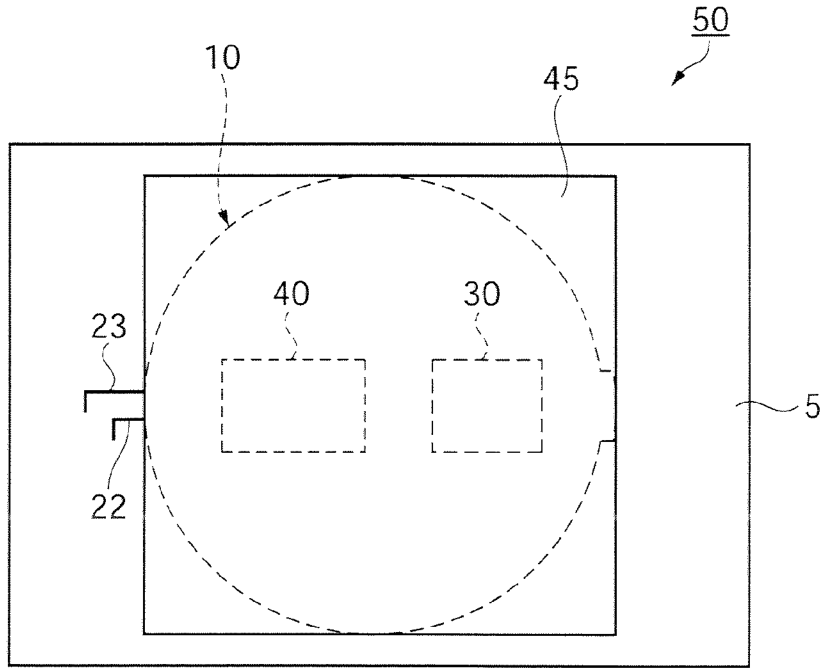
FIG. 2B is a schematic plan view of the atomic oscillator viewed from the above.

FIGS. 2A and 2B are diagrams for explaining the atomic oscillator of the embodiment. FIG. 2A is a schematic sectional view, and FIG. 2B is a schematic plan view of the oscillator viewed from the above.

Gas Cell

A gas cell which is a main part of the atomic oscillator of the embodiment will be first described. Referring to FIGS. 1A to 1C, a gas cell 10 is composed of a cylindrical portion 1 as a cylindrical part and windows 2 and 3 sealing openings at both ends of the cylindrical portion 1. Thus a cavity T1 is air-tightly formed. In the cavity T1, a great number of metal atoms which are obtained by gasifying alkali metal such as rubidium and cesium are sealed (not shown).

In the gas cell 10 in which metal atomic gas is sealed in its cavity T1, the windows 2 and 3 are made of a material having optical transparency such as glass. The windows 2 and 3 respectively constitute an incident surface and an emitting surface on the optical path of exciting light which excites the metal atomic gas. On the other hand, the cylindrical portion 1 does not need optical transparency, so that the cylindrical portion 1 may be made of metal or resin, for example. Alternatively, the cylindrical portion 1 may be made of an optical transparent material such as glass which is the same material of that of the windows 2 and 3.

On outer surfaces of the windows 2 and 3, a first heater 12 and a second heater 13 which are heating units of the gas cell 10 and are composed of transparent electrode films made of indium tin oxide (ITO), for example, are respectively formed in a layered manner. In the gas cell 10 of the embodiment, the first heater 12 is formed on the outer surface of the window 2 which constitutes the incident surface of the exciting light and the second heater 13 is formed on the outer surface of the window 3 which constitutes the emitting surface of the exciting light.

A first heater wiring 22 is extracted from a part of an edge part of the first heater 12. A second heater wiring 23 is extracted from a part of an edge part of the second heater 13. The first heater 12 and the second heater 13 are coupled to a controlling circuit substrate, which is described later, respectively through the first heater wiring 22 and the second heater wiring 23.

Further, the first heater 12 and the second heater 13 are coupled to each other by a third heater wiring 15 that is provided on lateral surfaces of a part of the windows 2 and 3 and on a part of the cylindrical portion 1. That is, the first heater 12 coupled to the circuit substrate through the first heater wiring 22 and the second heater 13 coupled to the circuit substrate through the second heater wiring 23 are coupled to each other in series by the third heater wiring 1*a*, forming a circuit. Here, the third heater wiring 15 of the embodiment is composed of a transparent electrode film made of ITO, for example, like the first heater 12 and the second heater 13, so that the third heater wiring 15 can be formed on the gas cell 10 in the same process as that of the heaters 12 and 13.

Atomic Oscillator

An atomic oscillator including the gas cell 10 described above will now be described.

Referring to FIGS. 2A and 2B, this atomic oscillator 50 includes: the gas cell 10 described above; a controlling circuit substrate 6 having various controlling circuits, including a temperature controlling circuit, of the atomic oscillator 50; a light source lamp 30 as a light source of the exciting light; a photo sensor 40 as a light detecting unit; an optical element layer 35; and a light reflection layer 45. In the embodiment, the optical element layer 35 is disposed on the outer side of the window 2 constituting the incident surface, of the exciting light, of the gas cell 10, the light source lamp 30 and the photo sensor 40 are disposed on the outer side of the optical element layer 35, and the light reflection layer 45 is formed on the outer side of the window 3 constituting the emitting surface of the exciting light. As shown by an arrow in FIG. 2, the exciting light emitted from the light source lamp 30 passes through the optical element layer 35 to travel inside the gas cell 10 in a direction from the window 2 to the window 3, then is reflected by the light reflection layer 45 to return in a direction from the window 3 to the window 2, and passes through the window 2 and the optical element layer 35 so as to be incident on the photo sensor 40. Thereby, an optical path of the exciting light can be elongated in the gas cell 10 and thus a distance on which the exciting light travels in the metal atomic gas can be secured. Accordingly, the atomic oscillator 50 can be miniaturized without degrading accuracy thereof.

The atomic oscillator 50 of the embodiment controls oscillation frequency by using light absorption property derived from a quantum interference effect produced when two kinds of light having different wavelengths from each other are made incident as coherent light having coherency, that is, the oscillator 50 utilizes coherent population trapping (CPT). Therefore, the semiconductor laser, for example, which is a light source of coherent light having coherency is used as the light source lamp 30. Here, the coherent light is light having coherency such as laser light produced by a semiconductor laser.

Further, the photo sensor 40 is composed of a solar cell or a photo diode, for example.

The light reflection layer 45 is so-called a reflection mirror having a total reflection film which is obtained by vapor-depositing aluminum, for example, on glass.

In the above structure, the optical element layer 35 is an optical layer that conducts dispersion in which an unnecessary light component of exciting light is removed and only a necessary light component is transmitted, or adjusts light intensity. A neutral density (ND) filter, a wavelength plate, or a layered body of these is used as the optical element layer 35, for example. Here, the ND filter is a neutral density optical filter that reduces light intensity without changing relative spectral distribution of energy of the light emitted from the light source lamp and showing any spectral selective absorption. A structure in which the optical element layer 35 is not provided may be adopted depending on accuracy required for the atomic oscillator 50.

In order to more accurately stabilize the temperature of the gas cell 10 and improve performance of the atomic oscillator 50, it is more effective that the temperature is controlled in a manner that the gas cell 10, the light source lamp 30, and the photo sensor 40 are housed in a container which can keep them warm.

Figure 6A:
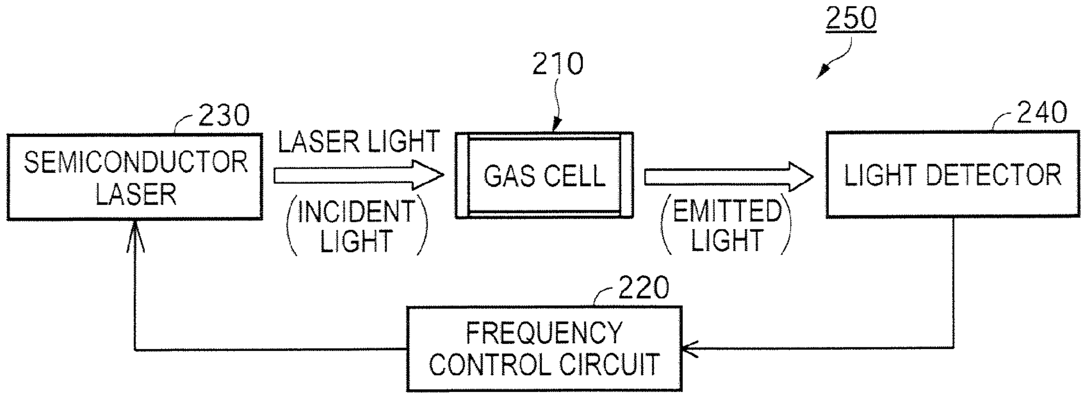
FIG. 6A is a schematic view for explaining a related art atomic oscillator.
Figure 6B:
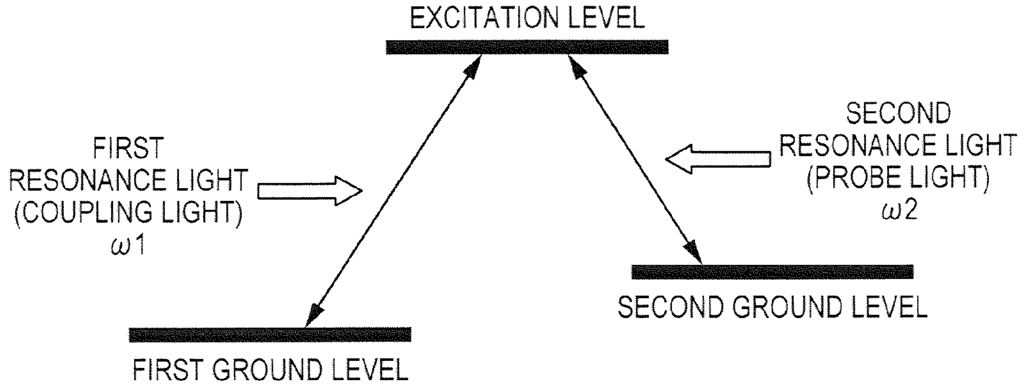
FIG. 6B is an explanatory diagram of energy levels of the atomic oscillator.
Figure 6C:
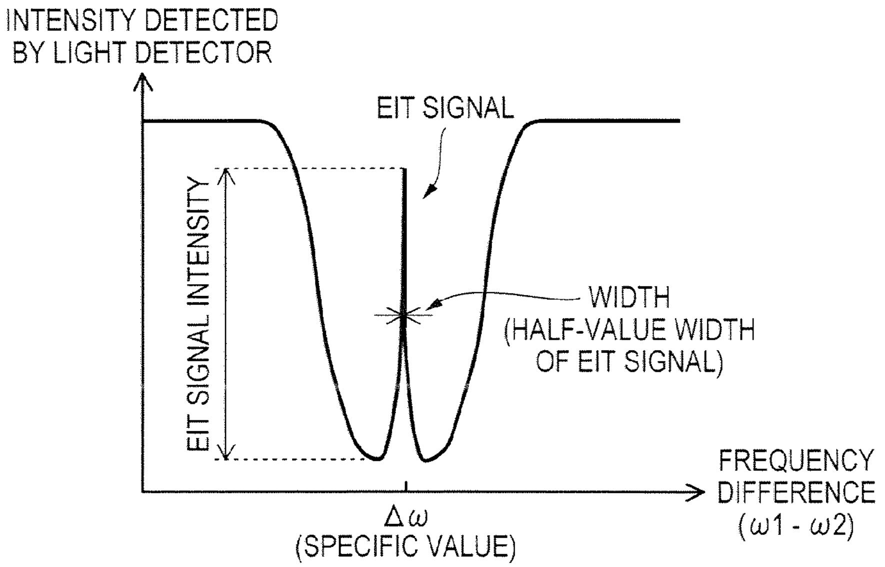
FIG. 6C is an explanatory diagram of light absorption spectrum of the atomic oscillator.

The atomic oscillator 50 of the embodiment utilizes atomic interference of coherent light such as laser light, that is, the oscillator 50 utilizes the CPT. In this method, in a Λ-type level system in which two ground levels receive exciting light to be excited and bonded with a common excitation level, when a difference between frequencies of two beams of exciting light that are simultaneously radiated precisely matches an energy difference between a first ground level and a second ground level, the Λ-type level system can be expressed by the coherent state between the first ground level and the second ground level. That is, the excitation to the excitation level is stopped. The CPT method uses this principle so as to detect and use a state in which light absorption is stopped in the gas cell 10 when one of or both of wavelengths of the two beams of exciting light are varied (refer to FIG. 6B).

According to the atomic oscillator 50 of the embodiment, the first heater 12 and the second heater 13 which are two heating units respectively formed on the window 2 and the window 3 of the gas cell 10 are coupled to each other in series by the third heater wiring 15. Thus, the first heater 12 and the second heater 13 can be coupled with the controlling circuit substrate 5 respectively by the first heater wiring 22 and the second heater wiring 23 that are the minimum number, that is, two of the heater wirings, so as to be driven and controlled. Therefore, deterioration of thermal efficiency, which is caused by leak of thermal energy from the heater wirings, of the first heater 12 and the second heater 13 can be suppressed. Further, a wiring space of the heater wirings is decreased, so that the atomic oscillator 50 which is miniaturized and consumes low amounts of power can be provided without deteriorating its performance.

Further, the atomic oscillator 50 of the embodiment utilizes a quantum interference effect produced when two kinds of light having different wavelengths from each other are made incident by using a coherent light source, which radiates coherent light such as laser light, as the light source lamp 30, that is, the oscillator 50 utilizes the CPT.

According to this structure, length of the gas cell in a traveling direction of exciting light can be shortened more than that in an atomic oscillator utilizing the double resonance method, so that the oscillator is suitable for miniaturization. Therefore, the number of heater wirings can be reduced, so that the oscillator especially exhibits such an advantage that deterioration of thermal efficiency of the first heater 12 and the second heater 13 is suppressed.

In the embodiment, the third heater wiring 15 is made of the same material as that of the first heater 12 and the second heater 13, so that the third heater wiring 15 can be efficiently formed with the same equipment as that used in a forming process of the first heater 12 and the second heater 13.

In the embodiment, the first heater 12 and the second heater 13 respectively formed on the outer surfaces of the windows 2 and 3 that are opposed to each other in the gas cell 10 are coupled in series by the third heater wiring 15 so as to make their current directions inverse to each other when electricity is applied to the first heater 12 and the second heater 13.

Accordingly, a magnetic field is hardly generated within the gas cell 10, being able to prevent deterioration of accuracy of the atomic oscillator 50, which is caused by variation of the resonance frequency due to magnetic force.

The atomic oscillation 50 described in the above embodiment may be modified as follows.

First Modification

The third heater wiring 15 having a shape shown in FIGS. 1A to 1C is formed as a heater wiring, which couples the first heater 12 and the second heater 13, of the gas cell 10 in the embodiment, but the shape of the heater wiring is not limited to it. The heater wiring may have any shape as long as the heater wiring can couple the first heater 12 and the second heater 13 while securing a constant thermal efficiency of the heaters 12 and 13.

Figure 3:
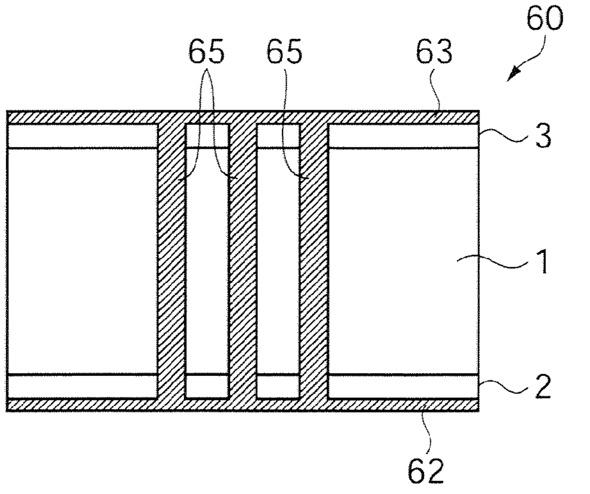
FIG. 3 is a schematic lateral view for explaining a gas cell of a first modification.

FIG. 3 is a schematic lateral view showing a gas cell, which is viewed from the same direction as FIG. 1C, of a first modification for explaining an example of a heater wiring having different shape from the third heater wiring 15 of the above embodiment. Here, elements same as those in the embodiment will be given the same reference numbers and their explanation will be omitted.

In a gas cell 60 shown in FIG. 3, a first heater 62 and a second heater 63 respectively formed on outer surfaces of the windows 2 and 3 and composed of transparent electrode films made of ITO, for example, are coupled to each other by heater wirings 65 of three lines formed on the cylindrical portion 1. The third heater wirings 65 are composed of a transparent electrode film as is the case with the first heater 62 and the second heater 63.

The first heater 62 and the second heater 63 are coupled to each other by the third heater wirings 65 of three lines in the first modification. However, the number of lines of the heater wirings and the width of the wirings are not limited to the number and the shape of the third heater wirings 65 shown in FIG. 3.

Second Modification

In the embodiment and the first modification, the third heater wiring 15 or the third wirings 65 are used only for electrically coupling the first heater 12 or 62 and the second heater 13 or 63. However, the third heater wiring can be used as a third heater heating the gas cell depending on its material or shape.

Figure 4:
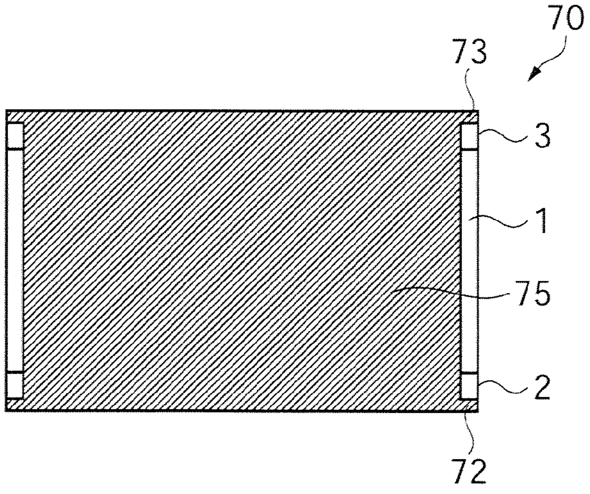
FIG. 4 is a schematic lateral view for explaining a gas cell of a second modification.

FIG. 4 is a schematic lateral view showing a gas cell viewed from the same direction as FIG. 1C for explaining that the third heater wiring is used as a third heater. Here, elements same as those in the embodiment and the first modification will be given the same reference numbers and their explanation will be omitted.

In a gas cell 70 shown in FIG. 4, a first heater 72 and a second heater 73 respectively formed on outer surfaces of the windows 2 and 3 and composed of transparent electrode films made of ITO, for example, are coupled by a heater wiring 75 having large width and formed on the cylindrical portion 1. The third heater wiring 75 is composed of a transparent electrode film like the first heater 72 and the second heater 73, and formed wide so as to cover nearly a half of a trunk of the cylindrical portion 1. The shape of the third heater wiring 75 is not limited to this. The third heater wiring 75 may be formed to have any shape and any size as long as the wiring 75 can heat the gas cell 70.

According to the gas cell 70 of the second modification, the third heater wiring 75 functions as the third heater, being able to further improve the thermal efficiency of the gas cell 70 and therefore stabilize performance of the atomic oscillator.

Third Modification

Figure 5:
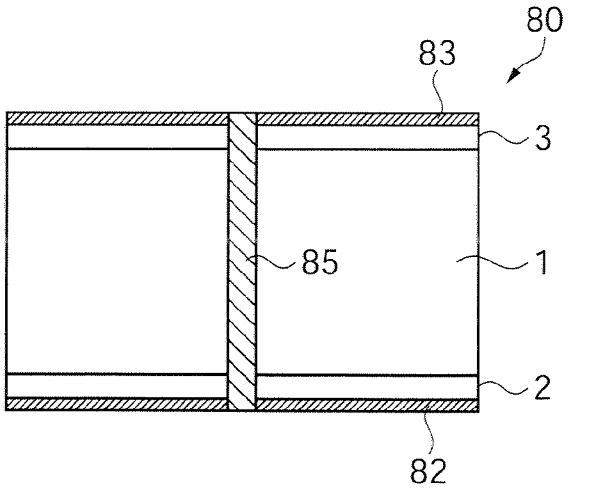
FIG. 5 is a schematic lateral view for explaining a gas cell of a third modification.

In the embodiment, the first modification, and the second modification, the third heater wiring(s) 15, 65, or 75 is composed of a transparent electrode film made of ITO, for example, as is the case with the first heater 12 or 62 and the second heater 13 or 63. However, the third heater wiring may be made of a conductive material which is different from the material of the first heater and the second heater. FIG. 5 is a schematic lateral view showing a gas cell viewed from the same direction as FIG. 1C for explaining that the third heater wiring is made of a material which is different from the material of the first heater and the second heater. Here, elements same as those in the embodiment and the first and second modifications will be given the same reference numbers and their explanation will be omitted.

This gas cell 80 shown in FIG. 5 includes a first heater 82 and a second heater 83 that are respectively formed on outer surfaces of the windows 2 and 3 and are composed of transparent electrode films made of ITO, for example. Further, on the cylindrical portion 1, a third heater wiring 85 coupling the first heater 82 and the second heater 83 is provided. The third heater wiring 85 can be formed by sputtering, depositing, or plating a metal material such as aluminum, or by discharging or printing a conductive paste material by an ink-jet method.

Alternatively, the third heater wiring 85 may be made of a metal material such as aluminum and a conductive paste material. Further, the third heater wiring 85 may be made of a transparent electrode film made of ITO, for example, and a conductive paste material. For example, by applying the conductive paste material made of ITO, for example, to both ends (around a boundary with the first heater 82 and around a boundary with the second heater 83) of a transparent electrode film which is formed on a part of the cylindrical portion 1, the first heater 82 and the second heater 83 can be easily coupled.

With this structure, choices of the material of the third heater wiring are increased and the forming process of the third heater wiring can be simplified depending on the choice of a forming method.

The embodiment and their modifications of the invention has been hereinbefore described. However, the invention is not limited to the embodiment but may be further modified within the scope of the invention.

For example, in the embodiment and the modifications, the gas cell 10 includes the cylindrical portion 1 of which the opening has a circular shape. However, the cylindrical portion may have an opening of an oval shape. Further, the cylindrical portion may have a polygonal column shape depending on accuracy required for an atomic oscillator. Alternatively, the cylindrical portion may have such a section in the longitudinal direction thereof that becomes narrow toward both ends from the center of the section, that is, a sectional convex form.

Figure 7:
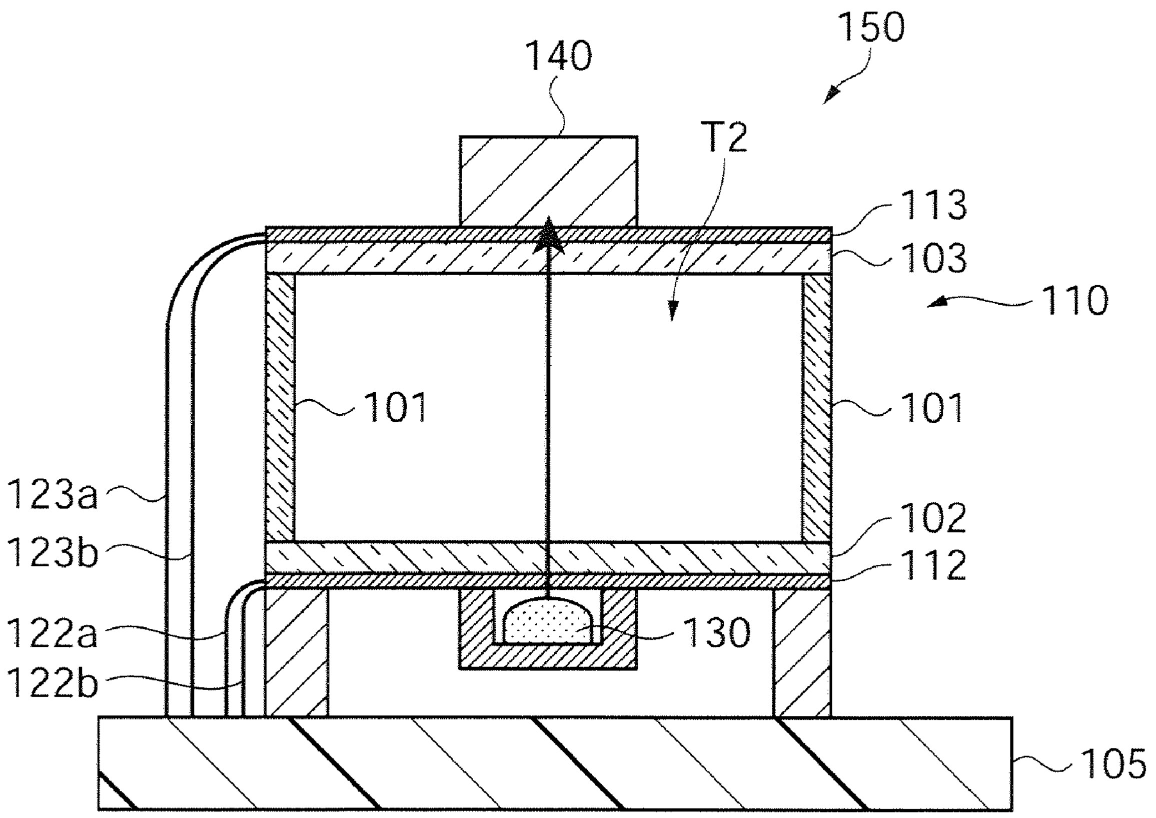
FIG. 7 is a schematic sectional view for explaining a related art atomic oscillator.

In the atomic oscillator 50 of the embodiment, the light source lamp 30 and the photo sensor 40 are disposed at a window 2 side at a light incident surface side of the gas cell 10 and the exciting light emitted from the light source lamp 30 is reflected by the light reflection layer 45 disposed at a window 3 side at a light emitting surface side of the gas cell 10 so as to be incident on the photo sensor 40. However, the light source may be disposed at the window side of the incident surface side of the gas cell and the light detector may be disposed at the window side of the emitting surface side as is the case with the atomic oscillator 150 of the related art example described with reference to FIG. 7.

Further, the gas cells 10, 60, 70, and 80 used in the atomic oscillator 50 utilizing the CPT are described in the embodiment. However, needless to say, the invention is applicable to an atomic oscillator utilizing the double resonance method using light from a light source and a microwave.

What is claimed is:

1. An atomic oscillator, comprising:

a gas cell in which a gaseous metal atom is sealed;

heating units heating the gas cell to a controlled temperature and being a first heater and a second heater;

a light source of exciting light exciting the metal atom in the gas cell;

a light detecting unit detecting the exciting light which has passed through the gas cell;

a substrate including at least a temperature controlling circuit for the heating units;

a first heater wiring coupling the first heater and the substrate;

a second heater wiring coupling the second heater and the substrate; and a third heater wiring coupling the first heater and the second heater, wherein the gas cell includes a cylindrical portion, and windows which constitute an incident surface and an emitting surface on an optical path of the exciting light, wherein the first heater and the second heater are respectively formed on the windows at an incident surface side and an emitting surface side and made of transparent heating materials, and wherein the third heater wiring is formed on the cylindrical portion.

2. The atomic oscillator according to claim 1, wherein the third heater wiring is made of a material same as a material of the first heater and the second heater.

3. The atomic oscillator according to claim 1, wherein the third heater wiring is disposed so as to make a current direction of the first heater inverse to a current direction of the second heater.

4. The atomic oscillator according to claim 1, wherein the light source is a coherent light source radiating coherent light, and an oscillation frequency is controlled by utilizing a light absorption property derived from quantum interference efficiency produced when two kinds of the coherent light as exciting light having different wavelengths from each other are made incident.

* * * * *